United States Patent
Tan et al.

(10) Patent No.: US 8,758,651 B2
(45) Date of Patent: Jun. 24, 2014

(54) CONDUCTIVE SLURRY FOR SOLAR BATTERY AND PREPARATION METHOD THEREOF

(75) Inventors: Weihua Tan, Shenzhen (CN); Zhen Liu, Shenzhen (CN)

(73) Assignee: BYD Company Limited (CN)

( * ) Notice: Subject to any disclaimer, the term of this patent is extended or adjusted under 35 U.S.C. 154(b) by 272 days.

(21) Appl. No.: 13/263,959

(22) PCT Filed: May 8, 2010

(86) PCT No.: PCT/CN2010/072545
§ 371 (c)(1),
(2), (4) Date: Oct. 11, 2011

(87) PCT Pub. No.: WO2010/135950
PCT Pub. Date: Dec. 2, 2010

(65) Prior Publication Data
US 2012/0032120 A1    Feb. 9, 2012

(30) Foreign Application Priority Data

May 27, 2009    (CN) .......................... 2009 1 0107759

(51) Int. Cl.
*H01B 1/16*    (2006.01)
*H01B 1/22*    (2006.01)
*H01L 31/0224*    (2006.01)

(52) U.S. Cl.
CPC ......... *H01L 31/022425* (2013.01); *Y02E 10/50* (2013.01); *H01B 1/22* (2013.01)
USPC ......................................................... 252/512

(58) Field of Classification Search
USPC ................................................ 252/512–514
See application file for complete search history.

(56) References Cited

U.S. PATENT DOCUMENTS

| | | | | |
|---|---|---|---|---|
| 8,029,701 | B2 * | 10/2011 | Kuwajima | 252/512 |
| 8,425,807 | B2 * | 4/2013 | Senda et al. | 252/512 |
| 2009/0101190 | A1 * | 4/2009 | Salami et al. | 136/244 |
| 2010/0258165 | A1 * | 10/2010 | Carroll et al. | 136/252 |
| 2013/0140500 | A1 * | 6/2013 | Jung et al. | 252/513 |

FOREIGN PATENT DOCUMENTS

| | | |
|---|---|---|
| CN | 101304049 A | 11/2008 |
| CN | 101609847 A | 12/2009 |
| JP | 2000090733 | 3/2000 |
| JP | 2005183144 A | 7/2005 |
| JP | 2007059380 A | 3/2007 |
| KR | 100801168 B1 | 2/2008 |
| WO | WO2010/117207 A2 * | 10/2010 |
| WO | WO 2010135950 A1 | 12/2010 |

OTHER PUBLICATIONS

Patent Cooperation Treaty, PCT International Search Report Issued in Connection with International Application No. PCT/CN2010/072545; Jul. 29, 2010; 5 pages; China.
Translation of Abstract from Publication No. CN 101304049 A; Nov. 12, 2008; 1 page; China.
Translation of Abstract from Publication No. CN 101609847; Dec. 23, 2009; 1 page; China.
American Elements: Aiuminum Nanoparticies Supplier & Tech Info; Aluminum Nanoparticles; printed Mar. 21, 2013; 2 pages.
Nabond Technologies Co.; Aluminum Nanopowder from NaBond; printed Mar. 21, 2013; 3 pages.
Abstract Translation of JP2005-183144: Jul. 7, 2005; 1 page; Japan.
Abstract Translation of JP2007-059380; Mar. 8, 2007; 2 pages; Japan.
Abstract Translation of JP2000-090733; Mar. 31; 2000; 1 page; Japan.
Abstract Translation of KR100801168; 1 page; Korea.
Abstract Translation of JP10247418; Sep. 14, 1998; 1 page; Japan.
Abstract Translation of JP03-167713; Jul. 19, 1991; 1 page; Japan.

* cited by examiner

*Primary Examiner* — Mark Kopec
(74) *Attorney, Agent, or Firm* — Greenberg Traurig, LLP

(57) ABSTRACT

A conductive slurry for a solar battery is disclosed, which comprises a first-order aluminum powder having a median diameter $D_{50}$ of about 2-8 um, a second-order powder having a median diameter $D_{50}$ of about 20-100 nm, a glass powder, and an organic carrier. The conductive slurry may be stable on a screen without leakage through screen, and there are no agglomeration and sedimentation during long-time storage. A method of preparing a conductive slurry for a solar battery is also disclosed, which comprises steps of mixing a first-order aluminum powder, a second-order powder, a glass powder, and an organic carrier to obtain a mixture; and then ball milling the mixture to obtain the conductive slurry. The method may be simple and easy to realize, so that it's advantageous for mass production in the industry.

12 Claims, No Drawings

CONDUCTIVE SLURRY FOR SOLAR BATTERY AND PREPARATION METHOD THEREOF

CROSS-REFERENCE TO RELATED APPLICATIONS

This patent application is a §371 national stage patent application based on International Patent Application No. PCT/CN2010/072545, filed May 8, 2010, entitled "CONDUCTIVE SLURRY FOR SOLAR BATTERY AND PREPARATION METHOD THEREOF," which claims priority to Chinese Patent Application No. 200910107759.9, filed on May 27, 2009, which are all incorporated herein by reference in the entirety.

BACKGROUND OF THE INVENTION

1. Technical Field of the Invention

The present disclosure generally relates to conductive slurries for a solar battery and preparation methods thereof. More particularly, the present disclosure relates to aluminum back surface field slurries for a solar batteries and methods of preparing the same.

2. Description of the Related Art

More and more attention has been paid on solar power as a green energy nowadays. The conventional Si based solar battery is generally manufactured by: printing a conductive slurry containing a conductive metal powder, a glass powder and an organic carrier onto a Si substrate, then drying and burning the substrate to prepare an electrode. Generally, the front electrode of the Si substrate is a negative electrode, and the conductive slurry coated on the negative electrode is generally the Ag conductive slurry. The back electrode of the Si substrate is a positive electrode, and the conductive slurry coated on the positive electrode is the Al conductive slurry.

The aluminum conductive slurry has great effects on the performance of the solar battery. The research on the aluminum conductive slurry is mainly focused on the following aspects: (1) enhancing the photoelectric conversion efficiency; (2) after being sintered the Al film having a strong adhesive force to the Si substrate, without any Al globules or bubbles; (3) after being sintered the Al film not crooking or crooking as less as possible; and (4) Ensuring the performance of other components of the solar battery and the EVA film.

To solve the above mentioned problems, an aluminum back surface field conductive slurry for a solar battery as well as a method of preparing the same are proposed in the prior art. The method comprises steps of: adding a certain amount of functional elements such as gallium (Ga), indium (In), or thallium (Ti), etc. to the original lead borosilicate glass powder so as to remelt the mixture; adding rosin to the slurry to improve the conductivity of the Al film; using calcium stearate (or zinc stearate) as a lubricant to improve the screen-printing performance of the slurry; employing a surface coated with a 3-5 nm conductive metal powder; screen printing the aluminum slurry prepared above onto the crystalline silicon solar battery such that the sintered solar battery plate is less crooked without any aluminum globules. Also, while forming a Si—Al compound, no scar is formed, and the aluminum film is smooth; the average photoelectric conversion efficiency of the monocrystalline silicon battery is greater than 17.0%. Moreover, by adding functional elements such as Ga, In, or Ti, etc. the conductivity of the glass powder is enhanced. Meanwhile the linear expansion coefficient of the glass powder is changed, so that there are certain effects on enhancing the photoelectric conversion efficiency and reducing the crooking degree of the silicon plate after being sintered.

Meanwhile, a method of preparing an aluminum back surface field conductive slurry for a solar battery by synthesizing is proposed in the prior art. In this method, the prepared slurry comprises about 0.1-5.0 wt % of an In powder. The glass powder with or without lead is obtained by chemical method. The battery plate obtained by sintering the above slurry has a high photoelectric conversion efficiency and conductivity, and the coating has a strong adhesive force to the silicon substrate. The silicon plate has no or a little crook. The aluminum film has a smooth surface with no aluminum globules or bubbles.

However, the aluminum back surface field conductive slurry prepared according to the above method may leak through the screen while being placed onto the screen before being printed, which may affect disadvantageously the quality of the product, and result in agglomeration and sedimentation during storage, thus disadvantageously and seriously affecting the application of the conductive slurry.

SUMMARY OF THE INVENTION

In view of the above problems, an embodiment of the present invention is directed to provide a conductive battery which may be stable on a screen without leakage through screen, and does not result in agglomeration and sedimentation during long-time storage.

In one aspect, there is provided a conductive slurry for a solar battery comprising: a first-order aluminum powder, a second-order powder, a glass powder, and an organic carrier, in which a median diameter $D_{50}$ of the first-order powder is about 2-8 um, and a median diameter $D_{50}$ of the second-order powder is about 20-100 nm.

In another aspect, there is provided a method of preparing a conductive slurry for a solar battery is disclosed, comprising steps of: mixing a first-order aluminum powder having a median diameter $D_{50}$ of about 2-8 um, a second-order powder having a median diameter $D_{50}$ of about 20-100 nm, a glass powder, and an organic carrier to obtain a mixture; and ball milling the mixture to obtain the conductive slurry.

The method of preparing the conductive slurry may be simple and easy to realize, so that it's advantageous for mass production in the industry.

DETAILED DESCRIPTION OF EMBODIMENTS OF THE INVENTION

These and other aspects, solutions and advantages of the invention will become apparent and more readily appreciated from the following descriptions taken in conjunction with the drawings.

According to one embodiment of the present invention, there is provided a conductive slurry for a solar battery, comprising: a first-order aluminum powder, a second-order powder, a glass powder, and an organic carrier, in which a median diameter $D_{50}$ of the first-order powder is about 2-8 um, and a median diameter $D_{50}$ of the second-order powder is about 20-100 nm. The conductive slurry comprising the above compositions may be stored for long time without leakage through the screen.

In some embodiments, the median diameter $D_{50}$ of the second-order powder is about 45-80 nm. To make the conductive slurry play a better role in the solar battery, in some embodiments of the invention, the second-order aluminum powder with a BET surface area of about 5-100 $m^2/g$, and more particularly about 25-85 m$^2$/g is employed. Meanwhile, as the electrode material of the solar battery, the impurities have great effects on the photoelectric conversion efficiency. To decrease disadvantageous effects of the impurities, the purity of the second-order aluminum powder is above 99.96%, and such second order aluminum power may be commercially purchased, such as the second-order aluminum powder having a median diameter $D_{50}$ of about 50 nm manufactured by SINONANO Company.

The median diameter $D_{50}$ of the first-order aluminum powder in the embodiments of the present invention may vary in a wide range, for example, the median diameter $D_{50}$ may be about 2.0-8.0 um, more particularly, about 3.5-7.0 um. Such first-order aluminum powder may be purchased commercially, such as the spherical aluminum powder with a median diameter $D_{50}$ of about 5.0 um manufactured by Yuanyang Company of He Nan province.

The conductive slurry having the above compositions may have good thixotropy property and workability, and is not easy to leak through the screen when being statically placed on the screen. The finished conductive slurry may not result in agglomeration or sedimentation during long-time storage. Meanwhile, the inventor of the present invention has found that the conductive slurry after being sintered forms an aluminum back surface field with greatly decreased square resistance, so that the ohmic series resistance of the Si solar battery may be decreased and the fill factor may be increased, thus improving more greatly the photoelectric conversion efficiency of the solar battery, in which the average photoelectric conversion efficiency of the monocrystalline silicon battery may be greater than 17.5%.

According to some embodiments, the above mentioned glass powder may comprise PbO—B$_2$O$_3$—SiO$_2$ system, PbO-B$_2$O$_3$—Al$_3$O$_2$ system, PbO—B$_2$O$_3$—ZnO system, Bi$_2$O$_3$—B$_2$O$_3$—SiO$_2$ system, or Bi$_2$O$_3$—B$_2$O$_3$—ZnO system, etc. To meet the environmental requirements and minimize the use of lead, in some embodiments of the invention, the glass powder may be of Bi$_2$O$_3$—B$_2$O$_3$—SiO$_2$ system. There are no particular requirements for the diameter of the glass powder in the embodiments of the present invention, and any suitable glass powder having a diameter known in the art may be employed. According to some embodiments, the median diameter $D_{50}$ of the glass powder may be about 0.05-6.0 um, more particularly about 0.2-3.5 um, and the glass powder may be purchased commercially, such as a glass powder with a median diameter $D_{50}$ of about 2.0 um manufactured by Nanfang Ceramic Glaze Company. The glass powder having the median diameter $D_{50}$ in the above range may further enhance the adhesiveness and decrease the internal resistance of the battery.

In some embodiments of the present invention, the initial melting point of the glass powder is a temperature at which the glass powder starts to melt and flow. The initial melting point of the glass powder in the conductive slurry of the solar battery may vary in a wide range. According to some embodiments, the initial melting point of the glass powder may be about 630-730° C., more particularly about 650-700° C. The inventor has found that: in the conductive slurry of the solar battery, when the initial melting point of the glass powder is within the above mentioned range, it may be advantageous for improving the adhesive force of the sintered aluminum film to the silicon base as well as the photoelectric conversion efficiency.

To make the glass powder play a better role in the conductive slurry of the solar battery, in some embodiments of the invention, the glass powder comprises: bismuth oxide, diboron trioxide, silicon dioxide, calcium oxide, alumina, zinc oxide, magnesia, zirconia, and strontia. Based on the total weight of the glass powder, the content of the bismuth oxide may be about 20-75 wt %, particularly about 30-65 wt %; the content of the diboron trioxide may be about 10-50 wt %, particularly about 20-45 wt %; the content of the silicon dioxide may be about 2.0-10 wt %, particularly about 2.5-8 wt %; the content of the calcium oxide may be about 2.0-8.0 wt %, particularly about 2.5-5.0 wt %; the content of the alumina may be about 0.5-4.5 wt %, particularly about 1.0-4.0 wt %; the content of the zinc oxide may be about 0-5.0 wt %, particularly about 0.2-4.0 wt %; the content of the magnesia may be 0-2.0 wt %; the content of the zirconia may be about 0-3.0 wt %, particularly about 0-2.0 wt %; and the content of the strontia may be 0-2.0 wt %. The initial melting point of the glass powder may be adjusted by changing the contents of the above mentioned compositions of the glass powder. For example, the preparation may be carried out by adjusting the contents of the compositions of the glass powder, the initial melting point of the glass powder obtained by the preparation is tested by burning the glass powder, then the contents of the compositions of the glass powder are adjusted again and the initial melting point is tested again, and the above steps are repeated until the initial melting point meets the requirements. The testing method of the initial melting point of the glass powder may be the well-know method in the art, for example comprises steps of: placing the glass powder into a furnace using silicon carbide rods, heating the glass powder and recording the temperature at which the glass powder starts to melt and flow, in which the recorded temperature is the initial melting point of the glass powder.

The above mentioned glass powder may be purchased commercially or prepared by the inventor. For example, the above mentioned various oxides whose contents are within the above mentioned respective ranges, respectively are mixed uniformly, and then the resultant mixture is placed into a ceramic crucible. The crucible is placed into a furnace with silicon carbide rods, preheated to 500-600° C. and maintained at 500-600° C. for 0.5 hours. Then the mixture is further heated to 900-1200° C. and melted for 0.5-1 h. The mixture is then quenched with water and filtered to obtain glass globules. The glass globules are placed into a ball-milling tank. According to the weight ratio that ZrO balls: glass globules: de-ionized water=2:1:0.5, at a tank rotating speed of 80-120/min, the glass globules are ball milled for over 72 h, and then filtered and dried to obtain the glass powder meeting the above requirements, wherein the median diameter $D_{50}$ of the glass powder is in the range of 0.2-3.5 um, and the initial melting point thereof is within 630-730° C.

The median diameter of the above obtained glass powder may be tested using a known equipment and method, such as BT-9300 laser particle size analyzer.

According to an embodiment of the invention, the above organic carrier comprises ethyl cellulose, a solvent, and a modified phenolic or epoxy resin. The modified phenolic resin may be a rosin modified phenolic resin, such as M210 resin manufactured by Guangdong Deqing Jixin Synthetic Resin Company; or 4-tert-butyl phenol formaldehyde resin, such as 2402 resin manufactured by Shanghai Nanda Chemical Company. The modified epoxy resin may be a bisphenol An epoxy resin such as SM618 or SM826 manufactured by Jiangsu Sanmu Group. The contents of each compositions of the above mentioned organic carrier may vary in a wide range. In an embodiment of the invention, base on the total weight of the organic carrier, the content of the ethyl cellulose may be about 3.0-15 wt %, the content of the modified phenolic or epoxy resin may be about 0-8.0 wt %, and the content of the solvent may be about 80-97 wt %. In another embodiment of the invention, the ethyl cellulose may be about 5.0-10 wt %, the modified phenolic or epoxy resin may be about 0-5.0 wt %, and the solvent may be about 85-95 wt %.

In the organic carrier of the embodiments of the invention, the solvent may be any kinds of known organic solvents. In an embodiment of the invention, the solvent is a mixed solvent of at least two of terpineol, di-n-butyl phthalate (DBP), butyl carbitol, turpentine, butyl carbitol acetate, ethylene glycol butyl ether, and ethylene glycol monoethyl ether acetate. In the mixed solvent, the contents of each composition do not have relationships with each other as long as the total weight of the mixed solvent is within the above mentioned range. The above solvent may be purchased commercially.

The above mentioned organic carrier may be prepared by the following method of: mixing ethyl cellulose, a modified phenolic or epoxy resin, and a solvent at a temperature of 50-80° C., and making the ethyl cellulose and the modified phenolic or epoxy resin sufficiently dissolved and uniformly mixed to obtain the transparent and uniform organic carrier.

According to embodiments of the present invention, a small amount of the second-order aluminum powder may improve the thixotropy property of the conductive slurry and reduce, to some extent, the leakage of the slurry through the screen. In an embodiment of the invention, base on the total weight of the conductive slurry, the first-order aluminum powder may be about 15-50 wt %, the second-order aluminum powder may be about 0.5-40 wt %, the glass powder may be about 0.2-15 wt %, and the organic carrier may be about 10-35 wt %. In another embodiment of the invention, the first-order aluminum powder may be about 30-45 wt %, the second-order aluminum powder may be about 10-35 wt %, the glass powder may be about 2-8 wt %, and the organic carrier may be about 15-32 wt %.

In another aspect of the present invention, there is provided a method of preparing a conductive slurry for a solar battery, and the method comprises steps of mixing the above mentioned first aluminum powder, the second aluminum powder, the glass powder and the organic carrier to obtain a mixture, and then ball milling the mixture.

In an embodiment of the invention, the first aluminum powder and the second aluminum powder are firstly mixed to obtain a mixed aluminum powder; then the mixed aluminum powder is mixed with the glass powder and the organic carrier to obtain a mixture, and the mixture is finally ball milled.

In an embodiment of the present invention, the organic carrier is placed into a stainless steel container of a high-speed stirrer, the glass powder is added to the container while stirring, stirring is continued until the mixture is uniform; and then the mixed aluminum powder is added to the mixture of the organic carrier and the glass powder in twice or thrice. Each time after adding the mixed aluminum powder, the mixture is stirred uniformly, and then the mixed aluminum powder is added for the next time; and after all of the mixed aluminum powder is added, the mixture is stirred at a high speed. Finally, the mixture is milled by a mill with three rollers of Ø150 for 15-20 times to obtain the conductive slurry for the solar battery.

A method of preparing the above solar silicon substrate from the conductive slurry is also provided. The method comprises steps of: coating the above obtained conductive aluminum slurry onto one surface of the monocrystalline silicon plate, in which the monocrystalline silicon has a size of 125×125 mm, a thickness of 200 um before etching, and a thickness of 180 um before printing, the screen mesh may be 280-300, the printed slurry may be 0.9-1.1 g, the drying temperature may be 250° C., and drying time may be 5 min; then coating a silver paste onto the other surface of the monocrystalline silicon plate, sintering the silicon plate using a tunnel furnace after drying the coated silver paste, in which the sintering temperature may be about 810-940° C. and present a gradient distribution, the sintering time may be 2 min, and the peak temperature may be maintained for about 2 seconds, thus obtaining a solar battery silicon plate.

The conductive slurry for the solar battery according to embodiments of the present invention may have no leakages through the screen when being statically placed on the screen, and may be suitable for long-time storage, without sedimentation or agglomeration. Meanwhile the solar battery prepared from the conductive slurry has a better photoelectric conversion efficiency.

The present invention is described in more details with reference to the following examples.

EXAMPLE 1

1. Preparation of an Organic Carrier

Based on the total weight of the organic carrier, 39 parts by weight of terpineol and 45 parts by weight of di-n-butyl phthalate (DBP) were mixed uniformly, and then 16 parts by weight of ethyl cellulose was added to the above mixed solvent, and finally the whole solution was heated to 45° C., so that the above compositions were sufficiently dissolved. Then the solution was mixed uniformly, thus obtaining a uniform and clear organic carrier A1.

2. Preparation of a Slurry for the Solar Battery

Based on the total weight of the conductive slurry, 30 parts by weight of an organic carrier A1 was placed in a stainless steel container of a high-speed stirrer, 4 parts by weight of a glass powder (a glass powder manufactured by Guangdong Foshan Nanfang Ceramic Glaze Company, with the median diameter $D_{50}$ of 5 um and the initial melting point of about 750° C.) was added while stirring, and then the mixture was stirred by the high-speed stirrer at a rotating speed of 500 rad/min for about 10 min.

52 parts by weight of a first-order aluminum powder (an aluminum powder with a super purity manufactured by Henan Yuanyang Company, with a median diameter $D_{50}$ of about 3 um) and 14 parts by weight of a second-order aluminum powder (an aluminum powder manufactured by SINONANO Company, with a median diameter $D_{50}$ of about 30 nm and a BET surface area of about 110m$^2$/g) were added.

The mixture was stirred for 60 min and then milled for 15 times using a miller with three rollers of Ø150, thus obtaining a solar battery conductive slurry S1.

EXAMPLE 2

1. Preparation of an Organic Carrier

Based on the total weight of the organic carrier, 42 parts by weight of butyl carbitol and 40 parts by weight of glycol butyl ether were mixed uniformly, and then 12 parts by weight of ethyl cellulose and 6 parts by weight of p-tert-butylphenol-formaldehyde resin (for example, 2402 type resin manufactured by Shanghai Nanda Chemical Company) were dissolved in the above mixed solvent, and finally the obtained mixture was heated to 45° C., so that the above compositions were sufficiently dissolved in the solution and the solution was stirred uniformly, thus obtaining a uniform and clear organic carrier A2.

2. Preparation of a Conductive Slurry of the Solar Battery

Based on the total weight of the conductive slurry to be prepared for the solar battery, 20 parts by weight of an organic carrier A2 was placed in a stainless steel container of a high-speed stirrer, 10 parts by weight of a glass powder (a glass powder manufactured by Guangdong Foshan Nanfang Ceramic Glaze Company, with a median diameter $D_{50}$ of 4 um and an initial melting point of about 800° C.) was added while stirring, and then the mixture was stirred by the high-speed stirrer at a rotating speed of 500 rad/min for about 10 min.

40 parts by weight of a first-order aluminum powder (an aluminum powder with super purity manufactured by Henan Yuanyang Company, with a median diameter $D_{50}$ of about 6 um) and 30 parts by weight of a second-order aluminum powder (an aluminum powder manufactured by SINONANO Company, with a median diameter $D_{50}$ of about 90 nm and a BET surface area of about 20 m$^2$/g) were added.

The mixture was stirred for 60 min and then milled for 15 times using a miller with three rollers of Ø150, thus obtaining a solar battery conductive slurry S2.

EXAMPLE 3

1. Preparation of an Organic Carrier

Based on the total weight of the organic carrier, 36 parts by weight of terpineol, 35 parts by weight of di-n-butyl phthalate (DBP), and 23 parts by weight of ethylene glycol monoethyl ether acetate were mixed uniformly, and then 4 parts by weight of ethyl cellulose and 2 parts by weight of rosin modified phenolic resin (for example, M210 resin manufactured by Guangdong Deqingjixin Synthetic Resin Company) were added to the above mixed solvent and finally the whole solution was heated to 45° C., so that the above compositions were sufficiently dissolved. Then the solution was mixed uniformly, thus obtaining a uniform and clear organic carrier A3.

2. Preparation of a Conductive Slurry of the Solar Battery

Based on the total weight of the conductive slurry to be prepared for the solar battery, 30 parts by weight of an organic carrier A3 was placed in a stainless steel container of a high-speed stirrer, 6 parts by weight of a glass powder (a glass powder manufactured by Guangdong Foshan Nanfang Ceramic Glaze Company, with a median diameter $D_{50}$ of 3 um and an initial melting point of about 600° C.) was added while stirring, and then the mixture was stirred by the high-speed stirrer at a rotating speed of 500 rad/min for about 10 min.

44 parts by weight of a first-order aluminum powder (an aluminum powder with super purity manufactured by Henan Yuanyang Company, with a median diameter $D_{50}$ of about 5 um) and 20 parts by weight of a second-order aluminum powder (an aluminum powder manufactured by SINONANO Company, with a median diameter $D_{50}$ of about 60 nm and a BET surface area of about 40 m$^2$/g) were added.

The mixture was stirred for 60 min and then milled for 15 times using a miller with three rollers of Ø150, thus obtaining a solar battery conductive slurry S3.

EXAMPLE 4

1. Preparation of an Organic Carrier

Based on the total weight of the organic carrier, 36 parts by weight of turpentine, 30 parts by weight of di-n-butyl phthalate (DBP), and 29 parts by weight of ethylene glycol monoethyl ether acetate were mixed uniformly, and then 4 parts by weight of ethyl cellulose and 1 part by weight of bisphenol A epoxy resin (for example, SM618 resin manufactured by Jiangsu Sanmu cooperation) were added to the above mixed solvent, and finally the whole solution was heated to 45° C., so that the above compositions were sufficiently solved. Then the solution was mixed uniformly, thus obtaining a uniform and clear organic carrier A4.

2. Preparation of a Conductive Slurry of the Solar Battery

Based on the total weight of the conductive slurry to be prepared for the solar battery, 12 parts by weight of organic carrier A4 was placed in a stainless steel container of a high-speed stirrer, 5 parts by weight of a glass powder (a glass powder manufactured by Guangdong Foshan Nanfang Ceramic Glaze Company, with a median diameter $D_{50}$ of 1 um and an initial melting point of about 620° C. was added while stirring, and then the mixture was stirred using the high-speed stirrer at a rotating speed of 500 rad/min for about 10 min.

49 parts by weight of a first-order aluminum powder (an aluminum powder with super purity manufactured by Henan Yuanyang Company, with a median diameter $D_{50}$ of about 4 um) and 34 parts by weight of a second-order aluminum powder (an aluminum powder manufactured by SINONANO Company, with a median diameter $D_{50}$ of about 50 nm and a BET surface area of about 60 m$^2$/g) were added.

The mixture was stirred for 60 min and then milled for 15 times using a miller with three-rollers of Ø150, thus obtaining a solar battery conductive slurry S4.

EXAMPLE 5

The preparation method of a conductive slurry of a solar battery was the same as example 3, the only difference was that the glass powder was self-prepared, and the preparation method was as follows.

Based on the total weight of the glass powder, 55 parts by weight of bismuth oxide, 30 parts by weight of diboron trioxide, 6 parts by weight of silicon dioxide, 4 parts by weight parts of calcium oxide, 1 part by weight of alumina, 1 part by weight of zinc oxide, 1 part by weight of magnesia, 1 part by weight of zirconia, and 1 part by weight of strontia were added to a high-speed stirrer and mixed for about 10 min.

The obtained mixture was then added to a ceramic crucible and the crucible was placed into a furnace with silicon carbide rods, the furnace was preheated to 550° C. and the temperature was maintained for 0.5 h. After the temperature was increased to 1000° C. and the obtained mixture was melted for 1 h, the mixture was then quenched with water and filtered, the obtained glass globules were placed in a ball milling container. According to the weight ratio 2:1:0.5 of zirconia globule: glass globules:deionized water, at a container rotating speed of 100 rad/min, the globules were ball milled for 72 h, and then filtered and dried to obtain the glass powder B1.

By being tested, the median diameter of glass powder B1 was about 4 um, and the initial melting point was about 650° C.

Finally, a conductive slurry S5 for the solar battery was prepared.

EXAMPLE 6

The preparation method of a conductive slurry of a solar battery was the same as example 4, but the only difference was that the glass powder was self-prepared, and the preparation method was as follows.

Based on the total weight of the glass powder, 45 parts by weight of bismuth oxide, 30 parts by weight of diboron trioxide, 7 parts by weight of silicon dioxide, 6 parts by weight parts of calcium oxide, 5 parts by weight of alumina, 3 parts by weight of zinc oxide, 1 part by weight of magnesia, 2 parts by weight of zirconia, and 1 part by weight of strontia were added to a high-speed stirrer and mixed for about 10 min.

The obtained mixture was then added to a ceramic crucible and the crucible was placed into a furnace with silicon carbide rods, the furnace was preheated to 550° C. and such temperature was maintained for 0.5 h. After the temperature was increased to 1000° C. and the obtained mixture was melted for 1 h, the mixture was then quenched with water and filtered, and the resultant glass globules were placed in the ball milling container. According to the weight ratio 2:1:0.5 of zirconia globule:glass globules:deionized water, at a container rotating speed of 100 rad/min, the globules were ball milled for 72 h, and then filtered and dried to obtain a glass powder B2.

By being tested, the median diameter of glass powder B2 was about 2 um, and the initial melting point was about 700° C.

Finally, a conductive slurry S6 for the solar battery was prepared.

EXAMPLE 7

The preparation method of the conductive slurry for solar battery was the same as example 5, but the difference was that the organic carrier and the glass powder were mixed and stirred for 10 min.

In another container, a first-order aluminum powder and a second-order aluminum powder were mixed and stirred for 30 min to obtain a mixed aluminum powder.

The mixed aluminum powder was averagely divided into 3 parts, under the condition that the organic carrier and the glass powder were stirred, the 3 parts of aluminum powder were added separately to a mixing organic carrier and a glass powder with a time interval of 2 min.

Finally, a conductive slurry S7 for the solar battery was obtained.

COMPARATIVE EXAMPLE 1

The preparation method for a conductive slurry for a solar battery of Comparative example 1 was the same as example 5, but the difference was that: the median diameter $D_{50}$ of a first-order powder was about 5 um, and the median diameter $D_{50}$ of a second-order powder was about 1 um.

Finally, a conductive slurry D1 for the solar battery was prepared.

COMPARATIVE EXAMPLE 2

The preparation method of a conductive slurry for a solar battery of Comparative example 2 was the same as example 5, but the only difference was that: a second-order aluminum powder was not contained, and the content of the first-order aluminum powder was 64 parts by weight.

Finally, a conductive slurry D2 for the solar battery was prepared.

Performance Test

The performance tests as follows were carried out for the conductive slurry S1-S7, D1 and D2:
1. Slurry Viscosity According to the method of GB/T17473.5-1998, the test was carried out using NDJ-79 rotating viscometer at a speed of 75 rad/min at 25° C.
2. Storage Stability The conductive slurry was sealed and stored at 25° C. After three months, the viscosity in the lower portion of the conductive slurry was tested, and the aluminum powder was observed to find out whether there was any sedimentation.
3. Leakage through Screen The conductive slurry was uniformly distributed on the metal screen having 280 meshes, and the thickness of the slurry was maintained to 20 mm, and then the slurry was on standing for 5 min. The back surface of the screen was observed to see whether there was any leakage.
4. Appearance The surface of the aluminum film was observed to see whether there was any marks of the screen.
5. Adhesive Force The aluminum film was placed in a running water for 7 days at 25° C., and then the aluminum film was checked to see if there was any cracking off.
6. Photoelectric Conversion Efficiency The above obtained conductive aluminum slurry was tested on the production lines. The monocrystalline silicon plate had a size of 125×125 mm, a thickness of about 200 um before corrosion, and a thickness of about 180 um before being printed. The mesh number of the screen was 280-300. The weight of the slurry printed on each plate was about 0.9-1.1 g, and the drying was performed at a temperature of about 250° C. for about 5 minutes. The other surface of the silicon plate was coated with a front silver slurry, and then the coated plate was dried and sintered in a tunnel furnace, with a sintering temperature of about 810-940° C. The temperature exhibits a gradient distribution, the sintering time was about 2 minutes, and the peak temperature was maintained for about 2 seconds. The sintered plate was then taken out and tested.

The conversion efficiency of the battery plate was tested by special testing device for a solar battery plate, such as a single flash stimulator. The testing conditions were standard testing conditions (STC):

Light-intensity: 1000W/m²
Spectrum: AM 1.5
Temperature: 25° C.
The testing method was according to IEC904-1.
The testing results were as shown in table 1.

TABLE 1

| Sample | Viscosity mPa·s | Increment of viscosity and stability of storage | Leakage through screen | Appearance and adhesive force of aluminum film | Photoelectric conversion efficiency |
| --- | --- | --- | --- | --- | --- |
| S1 | 45000 | Viscosity increased to 56000 mPa·s, no sedimentation of Al powder | No | Good appearance, slightly cracking off of the edge of aluminum film | 17.52% |

TABLE 1-continued

| Sample | Viscosity mPa·s | Increment of viscosity and stability of storage | Leakage through screen | Appearance and adhesive force of aluminum film | Photoelectric conversion efficiency |
|---|---|---|---|---|---|
| S2 | 65000 | Viscosity increased to 78000 mPa·s, no sedimentation of Al powder | No | Good appearance, cracking off of the edge of aluminum film | 17.50% |
| S3 | 35000 | Viscosity increased to 118000 mPa·s, no sedimentation of Al powder | No | Good appearance, no aluminum film cracking off | 17.78% |
| S4 | 113000 | Viscosity increased to 168000 mPa·s, no sedimentation of Al powder | No | Slight screen mark, no aluminum film cracking off | 17.50% |
| S5 | 38000 | Viscosity increased to 56000 mPa·s, no sedimentation of Al powder | No | Good appearance, no aluminum film cracking off | 17.65% |
| S6 | 45000 | Viscosity increased to 66000 mPa·s, no sedimentation | No | Good appearance, no aluminum film cracking off | 17.78% |
| S7 | 38500 | Viscosity increased to 45000 mPa·s, no sedimentation of Al powder | No | Good appearance, no aluminum film cracking off | 17.68% |
| D1 | 35000 | Viscosity increased to 78000 mPa·s, serious sedimentation of Al powder | serious | Good appearance, no aluminum film cracking off | 15.55% |
| D2 | 32000 | Viscosity increased to 83000 mPa·s, serious sedimentation of Al powder | serious | Slight screen mark, no aluminum film cracking off | 15.85% |

Without wishing to be bound by the theory, Applicants believe that Table 1 illustrates that: there was no leakage through the screen for the slurry prepared according to the present invention during screen printing; and the storage stability of the conductive slurry was high. During three months storage of the finished aluminum slurry, no serious sedimentation occurs. When the aluminum slurry was coated on the monocrystalline solar plate, with the sintering temperature of about 810-940° C., the sintering time of about 2 minutes, and the peak temperature maintained for about 2 seconds, the obtained aluminum film had a good surface condition. Especially while the employed glass powder has an initial melting point of 630-730° C., the adhesive force of the aluminum film was high, the surface was smooth with no globules, the aluminum film was not cracking off, and the monocrystalline battery had an average photoelectric conversion efficiency of above 17.50%.

Although explanatory embodiments have been shown and described, it would be appreciated by those skilled in the art that changes, alternatives, and modifications all falling into the scope of the claims and their equivalents can be made in the embodiments without departing from spirit and principles of the invention.

What is claimed is:

1. A conductive slurry for a solar battery, comprising: a first-order aluminum powder, a second-order aluminum powder, a glass powder, and an organic carrier, wherein a median diameter $D_{50}$ of the first-order aluminum powder is about 2-8 um, and a median diameter $D_{50}$ of the second-order aluminum powder is about 20-100 nm; the organic carrier comprises ethyl cellulose, a solvent, and a modified phenolic or epoxy resin.

2. The conductive slurry for a solar battery according to claim 1, wherein a BET surface area of the second-order aluminum powder is about 5-100 $m^2/g$.

3. The conductive slurry for a solar battery according to claim 1, wherein the median diameter $D_{50}$ of the first-order aluminum powder is about 3.5-7 um.

4. The conductive slurry for a solar battery according to claim 1, wherein the glass powder comprises $Bi_2O_3$-$B_2O_3$-$SiO_2$ system, and a median diameter $D_{50}$ of the glass powder is about 0.05-6.0 um.

5. The conductive slurry for a solar battery according to claim 4, wherein based on a total weight of the glass powder, the glass powder comprises about 20-75 wt % bismuth oxide, about 10-50 wt % diboron trioxide, about 2.0-10 wt % silicon dioxide, about 2.0-8.0 wt % calcium oxide, about 0.5-4.5 wt % alumina, 0—about 5.0 wt % zinc oxide, 0—about 2.0 wt % magnesia, 0—about 3.0 wt % zirconia, and 0—about 2.0 wt % strontia.

6. The conductive slurry for a solar battery according to claim 1, wherein an initial melting point of the glass powder is about 630-730° C.

7. The conductive slurry for a solar battery according to claim 6, wherein based on a total weight of the glass powder, the glass powder comprises about 20-75 wt % bismuth oxide, about 10-50 wt % diboron trioxide, about 2.0-10 wt % silicon dioxide, about 2.0-8.0 wt % calcium oxide, about 0.5-4.5 wt % alumina, 0—about 5.0 wt % zinc oxide, 0—about 2.0 wt % magnesia, 0—about 3.0 wt % zirconia, and 0—about 2.0 wt % strontia.

8. The conductive slurry for a solar battery according to claim 1, wherein based on a total weight of the glass powder, the glass powder comprises about 20-75 wt % bismuth oxide, about 10-50 wt % diboron trioxide, about 2.0-10 wt % silicon dioxide, about 2.0-8.0 wt % calcium oxide, about 0.5-4.5 wt % alumina, 0—about 5.0 wt % zinc oxide, 0—about 2.0 wt % magnesia, 0—about 3.0 wt % zirconia, and 0—about 2.0 wt % strontia.

9. The conductive slurry for a solar battery according to claim 1, wherein based on a total weight of the organic carrier, the ethyl cellulose is about 3.0-15 wt %, the phenol-formaldehyde resin modified or modified epoxy is 0—about 8.0 wt %, the solvent is about 80-97 wt %.

10. The conductive slurry for a solar battery according to claim 1, wherein, based on a total weight of the conductive slurry, the first aluminum powder is about 15-50 wt %, the second aluminum powder is about 0.5-40 wt %, the glass powder is about 0.2-15 wt %, and the organic carrier is about 10-35 wt %.

11. A method of preparing a conductive slurry for a solar battery, comprising steps of:
 mixing a first-order aluminum powder having a median diameter $D_{50}$ of about 2-8 um, a second-order aluminum powder having a median diameter $D_{50}$ of about 20-100 nm, a glass powder, and an organic carrier to obtain a mixture; and
 ball milling the mixture to obtain the conductive slurry.

12. The method of preparing a conductive slurry for a solar battery according to claim 11, wherein the first aluminum powder and the second aluminum powder are firstly mixed to obtain a mixed aluminum powder; and then the mixed aluminum powder is mixed with the glass powder and the organic carrier to obtain the mixture, and the mixture is finally ball milled.

\* \* \* \* \*